(12) United States Patent
Kato

(10) Patent No.: US 8,074,944 B2
(45) Date of Patent: Dec. 13, 2011

(54) CLAMP MEMBER AND CLAMPING METHOD

(75) Inventor: Kazunori Kato, Shizuoka (JP)

(73) Assignee: Toshiba Tec Kabushiki Kaisha, Tokyo (JP)

( * ) Notice: Subject to any disclaimer, the term of this patent is extended or adjusted under 35 U.S.C. 154(b) by 484 days.

(21) Appl. No.: 12/208,531

(22) Filed: Sep. 11, 2008

(65) Prior Publication Data

US 2009/0095504 A1    Apr. 16, 2009

(30) Foreign Application Priority Data

Oct. 12, 2007   (JP) ................... 2007-266522

(51) Int. Cl.
*F16M 3/08* (2006.01)
(52) U.S. Cl. ... 248/65; 248/49; 248/221.11; 361/679.02
(58) Field of Classification Search ............. 248/223.41, 248/224.61, 63, 65, 74.2, 689, 157, 917, 248/923, 49, 221.11, 316.1; 361/679.06, 361/679.22, 679.27, 681, 682, 679.02, 683; 174/97, 135, 481, 500
See application file for complete search history.

(56) References Cited

U.S. PATENT DOCUMENTS

| | | | | |
|---|---|---|---|---|
| 5,568,362 A | * | 10/1996 | Hansson | 361/736 |
| 5,816,081 A | * | 10/1998 | Johnston | 70/58 |
| 6,341,510 B1 | * | 1/2002 | Tervo et al. | 70/58 |
| 6,816,364 B2 | * | 11/2004 | Helot et al. | 361/679.06 |
| 7,126,815 B2 | * | 10/2006 | Hwang et al. | 361/679.06 |
| 7,455,267 B2 | * | 11/2008 | Kim | 248/65 |
| 7,745,961 B2 | * | 6/2010 | Kato | 307/326 |
| 2003/0132360 A1 | * | 7/2003 | Ju | 248/371 |

FOREIGN PATENT DOCUMENTS

JP    2003-224376    8/2003

* cited by examiner

*Primary Examiner* — Tan Le
(74) *Attorney, Agent, or Firm* — Patterson & Sheridan, LLP

(57) ABSTRACT

A clamp member includes a first member of a substantially L-shaped cross section having at the front end thereof a tongue section and formed to project from the main surface of the clamp member and a second member having at the front end thereof bent sections of a substantially L-shaped cross section juxtaposed with a notch interposed between them and formed to project from the main surface of the clamp member, the tongue section and the notch having a vertical positional relationship with the tongue section, the tongue section being disposed vis-à-vis the bent sections.

8 Claims, 4 Drawing Sheets

US 8,074,944 B2

CLAMP MEMBER AND CLAMPING METHOD

CROSS REFERENCE TO RELATED APPLICATIONS

This application is based upon and claims the benefit of priority from the prior Japanese Patent Application No. 2007-266522, filed on 12 Oct. 2007, the entire contents of which are incorporated herein by reference.

BACKGROUND OF THE INVENTION

1. Field of the Invention

The present invention relates to a clamp member and a clamping method that can clamp, for example, cables and cords of various different types and various different sizes in a neat and orderly manner 2. Description of the Related Art Cords including a power cord and signal cables are connected to an electronic device in order to connect it to external appliances. As electronic devices are made multifunctional, an increasing number of large cables need to be connected to such a device.

Cables connected randomly to such devices are detrimental to servicing and appearance and therefore binding tools for collectively binding cables have been proposed (e.g., refer to Patent Document: Jpn. Pat. Appln. Laid-Open Publication No. 2002-224376).

According to the above-cited Patent Document, when there are a number of sets of a plurality of cords connected to a plurality of circuit substrates that are contained in a housing, binding members are arranged at a longitudinal lateral side of the front panel of each of the circuit substrates to collectively hold bundles of cords such that the cables are arranged to extend from the binding members along the front panel and become connected to respective connector arranged at the front panel. Thus, the cables are arranged within the width of the front panel and do not obstruct the operation of drawing out a neighboring circuit substrate for servicing. Additionally, the cables do not collide with the circuit substrate being drawn out and hence are not damaged.

However, according to the above-described conventional art, each binding member binds a plurality of cords and holds them so that they are arranged within the width of the front panel of the corresponding circuit substrate. Therefore, it cannot cope with a situation where there are cables and cords of various different types and various different sizes particularly when the sheaths of the cables have different diameters.

SUMMARY OF THE INVENTION

In view of the above-identified circumstances, it is therefore an object of the present invention to provide a clamp member that can neatly clamp cables and cords of various different types and various different sizes.

In an aspect of the present invention, there is provided a clamp member including:

a first member of a substantially L-shaped cross section having at the front end thereof a tongue section and formed to project from the main surface of the clamp member; and a second member having at the front end thereof bent sections of a substantially L-shaped cross section juxtaposed with a notch interposed between them and formed to project from the main surface of the clamp member;

the tongue section and the notch having a vertical positional relationship with the tongue section, the tongue section being disposed vis-à-vis the bent sections.

DETAILED DESCRIPTION OF THE INVENTION

Throughout this description, the embodiments and examples shown should be considered as exemplars, rather than limitations on the devices and methods of the present invention.

Now, the present invention will be described below by referring to the accompanying drawings that illustrate a preferred embodiment of the invention. Throughout the drawings, the same components are denoted respectively by the same reference symbols and will not be described repeatedly.

This embodiment of electronic device according to the present invention is a POS (point of sales) terminal device. It may be needless to say that the characteristic features of the present invention are applicable to devices other than the POS terminal device.

Figure 1:
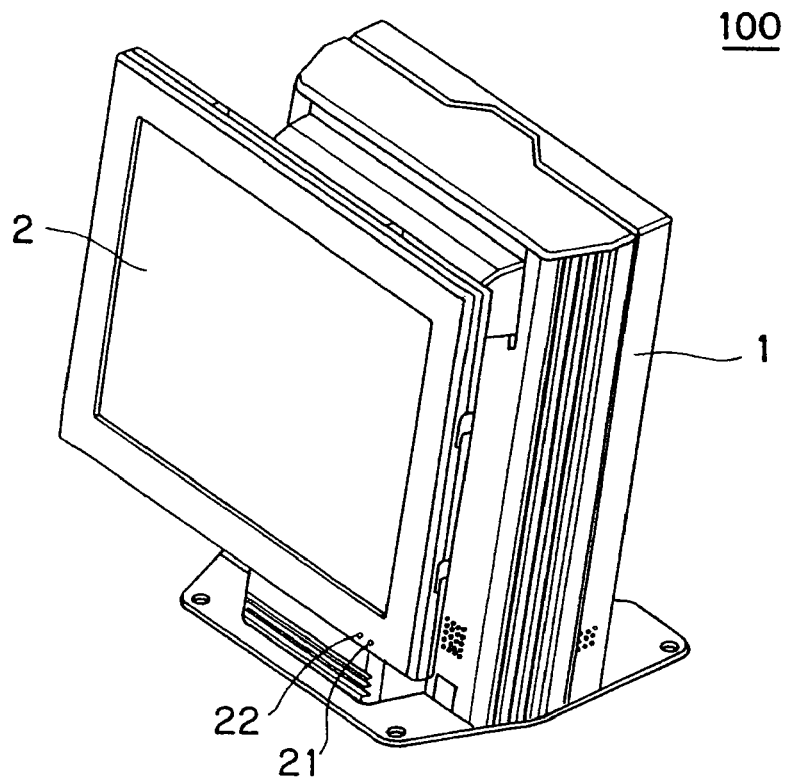
FIG. 1 is a schematic perspective view of a POS terminal device, showing the appearance thereof as viewed from the front side.
Figure 2:
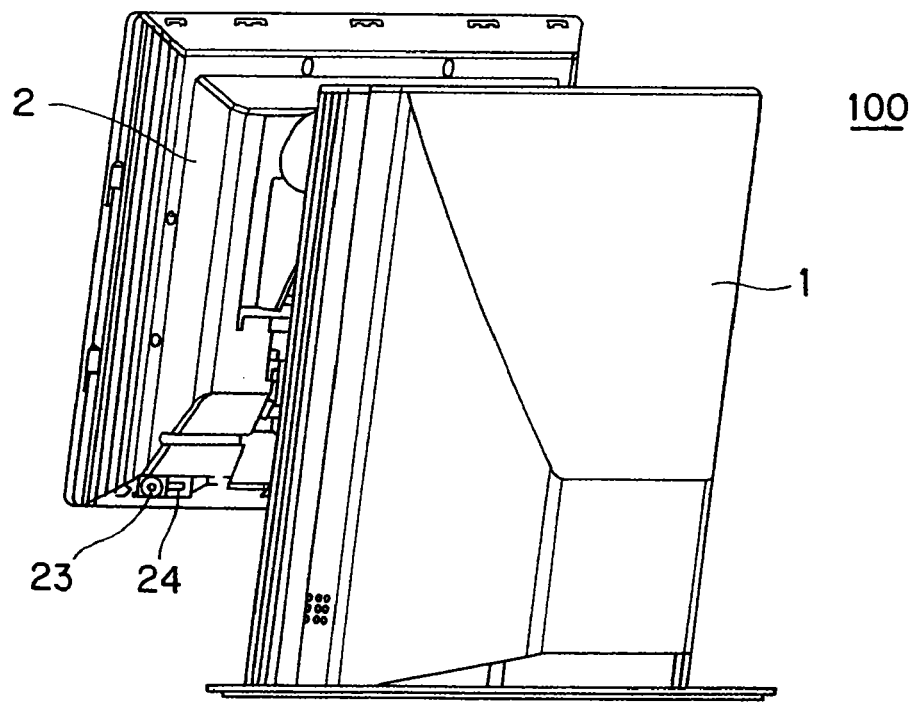
FIG. 2 is a schematic perspective view of the POS terminal device of FIG. 1, showing the appearance thereof as viewed from the rear side.

FIG. 1 is a schematic perspective view of the POS terminal device 100, showing the appearance thereof as viewed from the front side. FIG. 2 is a schematic perspective view of the POS terminal device 100, showing the appearance thereof as viewed from the rear side. As shown in FIG. 1, the POS terminal device 100 roughly includes a POS terminal section 1 and a display 2. The POS terminal device 100 is adapted to be optionally connected to a cash drawer for storing cash and/or checks. The POS terminal section 1 includes a substrate carrying a CPU (central processing unit), memories and so on, an HDD (hard disk drive), a power source and other components (all of which are not shown) that are contained in an inner cover 70 (which will be described in greater detail hereinafter). A predetermined general purpose OS is typically installed in the mother board and the POS terminal device 100 operates according to a predetermined application. The POS terminal section 1 will be described in greater detail hereinafter whenever necessary.

The display 2 is preferably a touch panel type TFT liquid crystal display. The display 2 is adapted to display an image for operating the POS terminal device 100 according to the application stored in the mother board in the POS terminal section 1. An LED 21 for the power source and an LED 22 for the HDD are arranged below the display 2. The LED 21 for the power source indicates the ON/OFF status of the POS terminal device 100. The LED 22 for the HDD is held on so long as the HDD in the POS terminal section 1 is being accessed.

As shown in FIG. 2, a power switch 23 and a luminance adjuster 24 are arranged at a lower part of the rear side of the display 2. The power switch 23 is a switch to which the operator turns on or off the power source of the POS terminal device 100. The luminance adjuster 24 is operated by the operator to adjust the luminance of the display 2 for comfortable viewing.

The display 2 can be operated by the operator to select the position and the angle thereof. For example, it can be tilted upward from a home position as shown in FIGS. 1 and 2 within an angular range between 10 and 60 degrees. When operating the power switch 23 and the luminance adjuster 24, it will be convenient for the operator to tilt the display 2 in order to make the operating area of the device easily visible. Thus, the tilting angle is preferably selectable.

Figure 3:
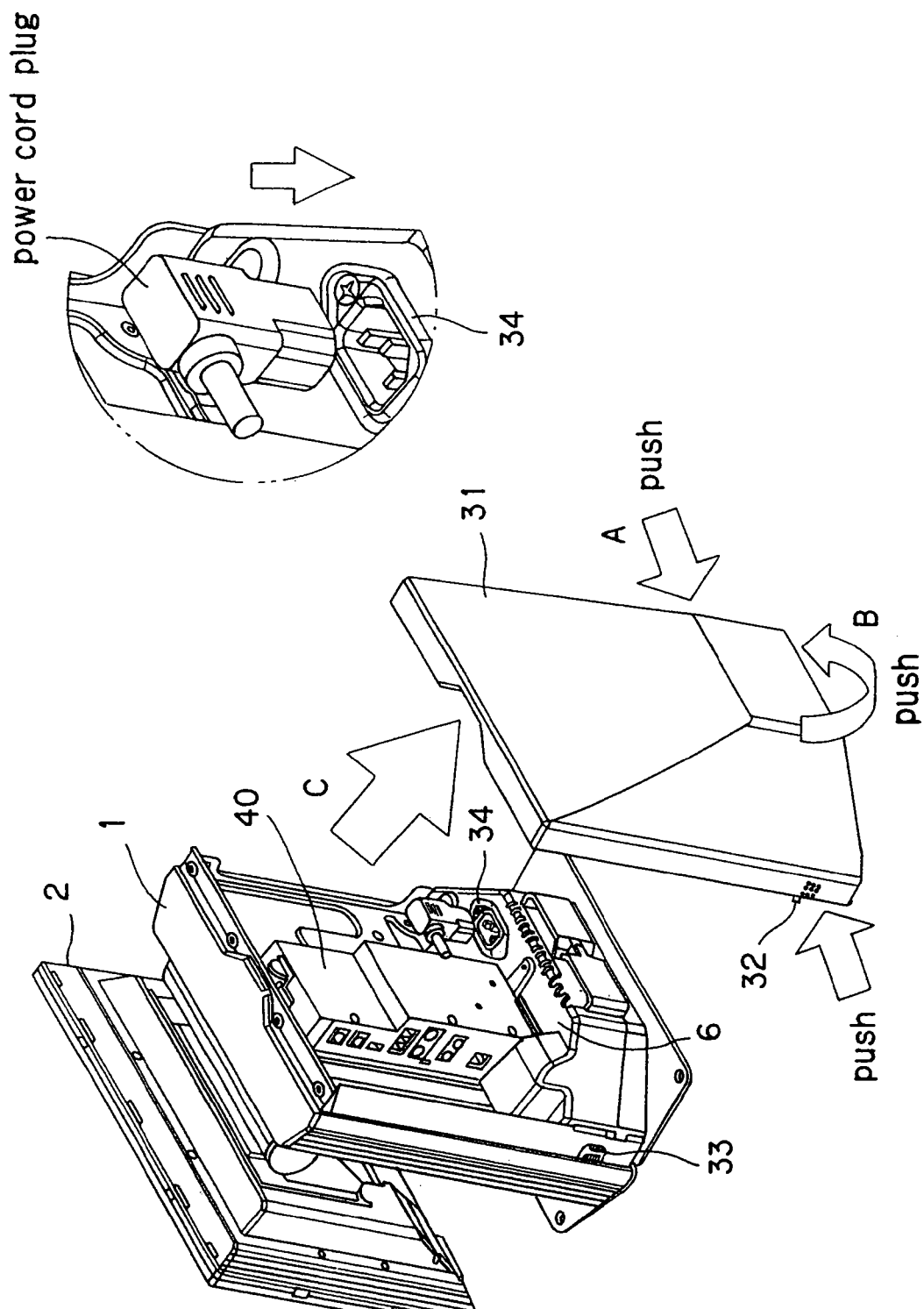
FIG. 3 is a schematic illustration of the connection of a power cord.

FIG. 3 is a schematic illustration of the connection of the power cord plug. As shown in FIG. 3, the rear side of the POS terminal section 1 is covered by a rear surface cover 31. The rear surface cover 31 is a molded resin cover for protecting a cover 6 and a connector section 40, both of which will be described in greater detail hereinafter, against dust and the like.

To connect the power cord plug to the POS terminal device 100, the operator pushes the rear surface cover 31 of the POS terminal section 1 at the two lateral facets (A). Since the rear surface cover 31 is a molded resin cover, it is resiliently deformed as it is pushed so that anchor claws 32 formed on the rear surface cover 31 are released from respective holding sections 33 of the POS terminal section 1. Then, the operator lifts up the rear surface cover 31 at a lower part thereof (B). Subsequently, as the operator pulls the rear surface cover 31 toward him- or herself, the rear surface cover 31 can be removed from the POS terminal section 1.

As shown in FIG. 3, in the POS terminal section 1, the power source, the substrates and other parts are contained and covered by the inner cover 70 and the inner cover 70 is then covered by the cover 6. The inner cover 70 is provided with an AC inlet 34. As the rear surface cover 31 is removed, the operator can access the AC inlet 34. Then, as a predetermined power cord plug is inserted into the AC inlet 34, the POS terminal device 100 can be powered by a commercial power supply.

Figure 4:
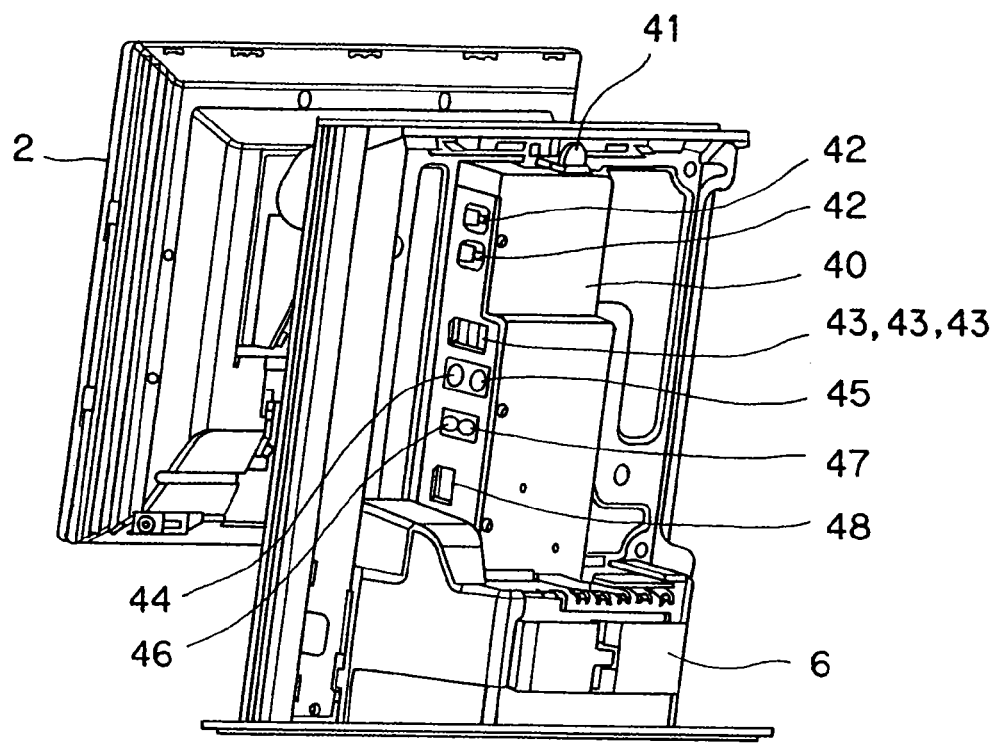
FIG. 4 is a schematic illustration of connectors to be used for connecting the POS terminal device to external appliances.
Figure 5:
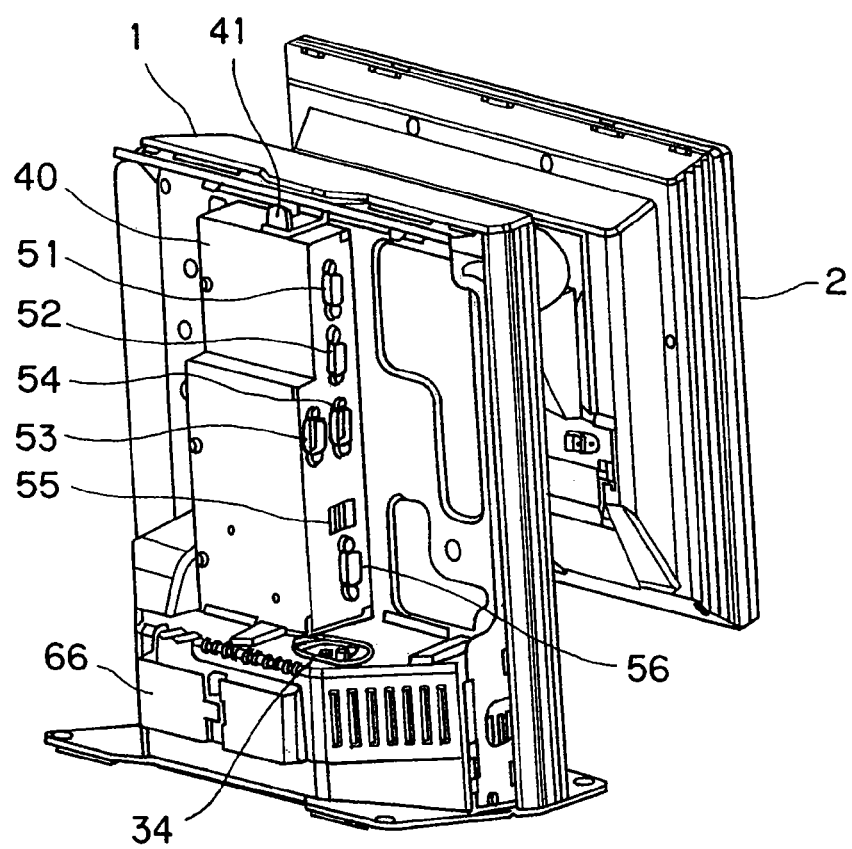
FIG. 5 is a schematic illustration of terminals to be used for connecting the POS terminal device to external appliances.

FIG. 4 and FIG. 5 schematically illustrate terminals to be used for connecting the POS terminal device 100 to one or more than one external appliance.

Referring to FIG. 4, a VFD (fluorescent display) connector 41 is arranged on the top part of a box-shaped connector section 40 that is arranged in the inside of the POS terminal section 1. Two cash drawer terminals 42 are arranged at an upper part of the left side of the connector section 40. Three USB (universal serial bus) ports 43 are arranged below the cash drawer terminals 42. A mouse port 44 and a keyboard port 45 are arranged side by side below the USB ports 43. A microphone terminal 46 and a speaker terminal 47 are arranged side by side below the mouse port 44. An Ethernet (trademark) LAN terminal 48 is arranged below the microphone terminal 46.

Now, referring to FIG. 5, an external VFD connector 51 is arranged at an uppermost part of the right side of the connector section 40 that is arranged in the inside of the POS terminal section 1. A general purpose connector 52 is arranged below the external VFD connector 51. A modem, a bar code scanner, a serial interface type balance or an EFT (electronic fund transfer) terminal for electronically settling accounts can be connected to the general purpose connector 52, which is a male type connector. General purpose connectors 53 and 54 are arranged side by side below the general purpose connector 52. The general purpose connector 53 may typically be same as the general purpose connector 52. The general purpose connector 54 is a female type connector and a modem, a bar code scanner, a serial interface type balance or an EFT (electronic fund transfer) terminal for electronically settling accounts can be connected thereto. A USB port 55 is arranged below the general purpose connector 53. The USB port 55 may typically be a 24V powered USB. A receipt printer may suitably be connected to the powered USB port. An extension VGA (video graphics array) interface female type connector 56 is arranged below the USB port 55.

Figure 6:
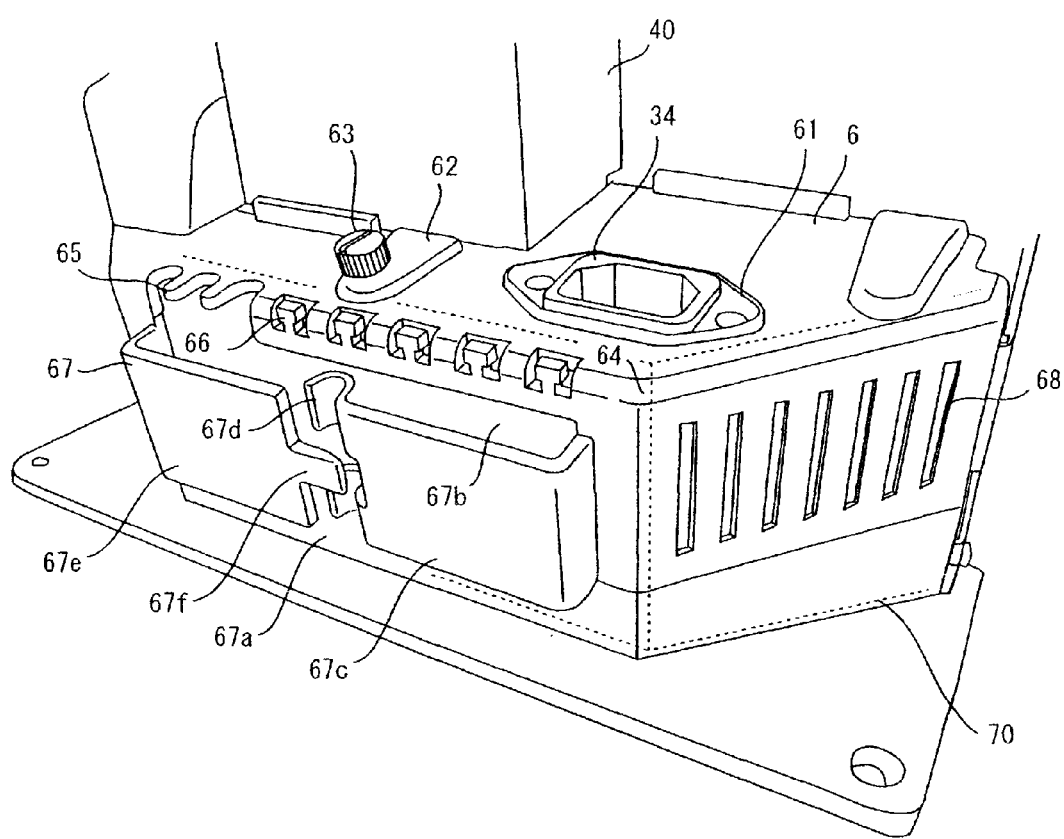
FIG. 6 is a schematic perspective view of a cover.

FIG. 6 is an enlarged schematic perspective view of a lower part of the POS terminal section 1 where the connectors and the ports described above are arranged and become exposed when the rear surface cover 31 is removed from the POS terminal section 1. Referring to FIG. 6, the cover 6 that covers the inner cover 70 indicated by a broken line is shown. The cover 6 is preferably a molded resin cover that is made of ABS resin in order to provide it with insulating and resilient properties. The cover 6 is designed to protect the inner cover 70 under which mainly the power source section, the HDD and the substrates such as the mother board of the POS terminal section 1 are contained. An inlet protecting section 61 is formed on top of the cover 6 so as to surround the AC inlet 34. More specifically, the AC inlet section 34 is adapted to be engaged with the inlet protecting section 61 with a slight gap provided between them. The inlet protecting section 61 is preferably provided with an about 2 mm high edge for suitably protecting and aligning itself with the AC inlet 34.

A fitting section 62 is arranged adjacent to the inlet protecting section 61 in order to fit the cover 6 to the POS terminal section 1. The fittings section 62 is provided with, for example, a knurled clamp screw 63 so as to screw the POS terminal section 1 with the cover 6. Since the clamp screw 63 can be loosened by means of fingers, the cover 6 can be mounted and removed without using any tool. The cover 6 is bent downward from the top surface where the inlet protecting section 61 is formed. The bent section 61 is provided with a plurality of groove sections 65 having a curved profile resembling the outer profile of a cable so that the cables connected to the POS terminal section 1 may be supported in an orderly array. The size of each of the groove sections 65 is preferably determined according to the outer diameter of the sheath of the cable to be received by the groove. More specifically, since the sheaths of a plurality of cables to be connected to the POS terminal section 1 generally show different diameters, the groove sections 65 may preferably be formed in the descending order of the sizes thereof so that the cables may be received by the respective groove sections 65 in a highly neat and orderly manner.

Referring further to FIG. 6, hanger sections 66 for hanging binder bands for neatly binding narrow and twisted signal wires and cables are formed at the right side of the groove sections 65. A clamp section 67 having an opposed substantially L-shaped cross section is formed below the groove sections 65 and the hanger sections 66 and is projected from and formed integrally with one of the surfaces of the cover 6. The clamp section 67 includes a power cord clamping section 67a for clamping the power cord along the outer profile thereof and a holding section 67b for arranging in array and holding cords and signal cables other than the power cord. The power cord clamping section 67a is formed at a front end part of and integrally with one of a pair of substantially L-shaped sections 67c, or substantially L-shaped section 67c, and has a curved contour with a substantially semicircular cross section so as to adapt itself to clamping the power cord along the outer profile thereof. The bent section 67d of the power cord clamping section 67a is provided, at a transversal middle part thereof, with a notch so as to divide the bent section 67d into two halves. Thus, as a matter of fact, there are two bent sections 67d, 67d that are juxtaposed with the notch interposed between them. The other substantially L-shaped section 67e is provided at the frond end thereof with a tongue section 67f at a position located vis-à-vis the notch of the bent section 67d at the same level in terms of vertical positional relationship. Therefore, the power cord clamping section 67a holds the power cord in the region defined by the bent section 67d of one of the substantially L-shaped section 67c and the tongue section 67f of the other substantially L-shaped section 67e. Additionally, cords other than the power cord are held in the region defined by the substantially L-shaped section 67e and the groove sections 65. Similarly, signal cables are held in the region defined by the substantially L-shaped section 67c and the hanger sections 66.

When the sizes of the above-described groove sections 65 are differentiated, grooves for large diameter cables may be arranged close to the bent section 67d and those for small diameter cables may be arranged remote from the bent section 67d so that the power cord, cords and signal cables may be arranged in a highly well sorted manner.

Heat radiating slits 68 are arranged in parallel on the other surfaces of the cover 6 as shown in FIG. 6.

As pointed out above, the power cord and cords and cables other than the power cord can be clamped in a highly neat and orderly manner because of the power cord clamping section 67a and the holding section 67b that are formed in the clamp section 67. Therefore, the connecting areas of the cords including the power cord such as the AC inlet and connectors are relieved of stress.

Now, the operation of accessing the mother board or the like contained in the POS terminal device 100 having the above-described configuration for the purpose of checking, replacing one or more than one components or installing one or more than one additional memories will be described below.

(1) Firstly, the operator takes off the rear surface cover 31 at the rear side of the POS terminal section 1 of the POS terminal device 100. To do this, as pointed out above, the operator pushes the rear surface cover 31 of the POS terminal section 1 at the two lateral facets and releases the anchor claws 32 from the respective holding sections 33 of the POS terminal section 1. Then, the operator lifts a lower part of the rear surface cover 31 and pulls it toward him- or herself. As a result, the rear surface cover 31 can be removed from the POS terminal section 1.

(2) As the rear surface cover 31 is removed, the power cord plug becomes exposed. Then, the operator pulls out the power cord plug from the AC inlet 34.

(3) Thereafter, the operator takes off the power cord from the clamp section 67.

(4) Then, the operator takes off the cords and the cables other than the power cord from the clamp section 67 by way of the gap between the bent section 67d and the tongue section 67f. At this time, if binder bands are used to bind the cables, an additional operation of twisting the binder bands and removing them from the hanger sections 66 is required.

(5) Subsequently, the operator loosens and pulls out the clamp screw 63 and takes the cover 6 off the inner cover 70.

(6) As the inner cover 70 is removed from the main body of the POS terminal section 1, the operator can access the mother board and other components for the purpose of checking, replacing one or more than one components and/or installing one or more than one additional memories.

After the end of the operation of checking, replacing one or more than one components and/or installing one or more than one additional memories, the operator follows the above listed procedures reversely. Then, as a result, the cords and the cables can be reliably clamped, while relieving the connecting areas of the cords including the power cord such as the AC inlet and connectors from stress.

Thus, with the structure of this embodiment, any of the substrates including the mother board, the HDD, the power source and the other electronic components contained in the inside of the POS terminal section 1 cannot be accessed unless the power cord plug is pulled out so that the danger of electric shock and/or any possible damage of the components can be reliably prevented from taking place.

The present invention is by no means limited to the above-described embodiment, the components of which may be modified and altered in various different ways on the course of embodying the invention. Additionally, any of the plurality of components disclosed in the above embodiment may be appropriately combined to embody the present invention in different ways. For example, some of the components of the embodiment may be omitted and components of different embodiments may be appropriately combined.

What is claimed is:

1. A clamp member comprising:
 a first member of a substantially L-shaped cross section having at the front end thereof a tongue section and formed to project from the main surface of the clamp member;
 a second member having at the front end thereof bent sections of a substantially L-shaped cross section juxtaposed with a notch interposed between them and formed to project from the main surface of the clamp member;
 a third member formed with a plurality of groove sections of a substantially semicircular cross section, showing a groove like profile; and
 a fourth member having a plurality of hanger sections adapted to hang respective binding members for binding cables;
 the tongue section and the notch having a vertical positional relationship with the tongue section, the tongue section being disposed vis-à-vis the bent sections, the third member and the fourth member being located above the first member and the second member on the main surface.

2. The clamp member according to claim 1, wherein a power cord is held in a region formed by the tongue section and the bent sections and cords other than the power cord are held in a region formed by the first member, the second member and the groove sections.

3. The clamp member according to claim 1, wherein the sizes of the groove sections differ from each other.

4. The clamp member according to claim 1, wherein signal cables are held in a region formed by the first member, the second member and the fourth member.

5. The clamp member according to claim 1, wherein the clamp member is molded integrally and made of ABS resin.

6. The clamp member according to claim 1, further comprising:
 an inlet protecting section to be engaged with an inlet for a power cord plug for connecting an electronic device to a commercial power supply and is formed integrally with a cover for covering a power source section of the electronic device.

7. The clamp member according to claim 6, wherein the electronic device is a POS terminal device having a POS terminal section and a touch input type display.

8. The clamp member according to claim 1, wherein third member is configured to support a cable, and wherein the plurality of groove sections included in the third member resemble an outer profile of the cable.

* * * * *